(12) United States Patent
Lin (10) Patent No.: US 8,331,517 B2
(45) Date of Patent: Dec. 11, 2012

(54) SERIAL LINK RECEIVER AND METHOD THEREOF

(75) Inventor: Chia-Liang Lin, Fremont, CA (US)

(73) Assignee: Realtek Semiconductor Corp., Science Park, Hsinchu (TW)

( * ) Notice: Subject to any disclaimer, the term of this patent is extended or adjusted under 35 U.S.C. 154(b) by 359 days.

(21) Appl. No.: 12/826,642

(22) Filed: Jun. 29, 2010

(65) Prior Publication Data
US 2011/0316600 A1 Dec. 29, 2011

(51) Int. Cl.
*H04L 7/02* (2006.01)
(52) U.S. Cl. ........................................ 375/360
(58) Field of Classification Search ............... 375/355, 375/360, 371
See application file for complete search history.

(56) References Cited

U.S. PATENT DOCUMENTS 3,755,624 A * 8/1973 Sekimoto ................. 348/495
6,707,314 B2 * 3/2004 Kasahara et al. ............. 326/38
2009/0079479 A1 * 3/2009 Chen ........................... 327/156
2011/0050305 A1 * 3/2011 Lin ............................. 327/158

OTHER PUBLICATIONS

Masum Hossain et al, "5-10 Gb/s 70 mW Burst Mode AC Coupled Receiver in 90-nm CMOS," IEEE Journal of Solid-State Circuits, vol. 45, No. 3, Mar. 2010.

* cited by examiner

*Primary Examiner* — Don N Vo
(74) *Attorney, Agent, or Firm* — IPR Works, LLC (57) ABSTRACT

A method and apparatus of clock recovery is disclosed. The apparatus comprising: a first delay circuit for receiving an input data signal and outputting a delayed data signal; an edge extraction circuit for outputting an edge signal by detecting a transition in the input data signal; a clock generator for generating a first clock signal based on an injection of the edge signal, wherein the first clock signal comprises a plurality of phase signals; a second delay buffer for outputting a second clock signal according to the first clock signal; a sampler for outputting a plurality of samples based on sampling the delayed data signal in accordance with the phase signals; and a decision circuit for generating a decision in accordance with the second clock signal based on the three samples and a previous decision.

20 Claims, 7 Drawing Sheets

SERIAL LINK RECEIVER AND METHOD THEREOF

FIELD OF TECHNOLOGY

This disclosure relates to serial link receiver.

BACKGROUND

Serial link is used in many applications. A serial sink comprises a transmitter, a transmission medium, and a receiver. The transmitter transmits onto a first end of the transmission medium a two-level signal representing a serial binary data stream timed in accordance with a first clock. The two-level signal traverses along the transmission medium and evolves into a dispersed signal as it reaches at a second end of the transmission medium due to a dispersion of the transmission medium. The dispersed signal is received by the receiver at the second end of the transmission medium. The receiver equalizes the dispersed signal into an equalized signal to at least partly remedy the dispersion of the transmission medium. The receiver generates a second clock by extracting a timing embedded in the equalized signal, and then it uses the second clock to sample the equalized signal to retrieve the serial binary data stream. Ideally, a timing of the second clock will track a timing of the first clock. In many applications, the first clock may be a spread-spectrum clock (SSC) wherein a low frequency modulation is used to reduce a power spectral density of an electromagnetic emission associated with the clock. For these applications, the frequency modulation of the first clock makes it more difficult for the second clock to track the first clock.

BRIEF SUMMARY

In an embodiment, an apparatus is disclosed, the apparatus comprising: a first delay circuit for receiving an input data signal and outputting a delayed data signal; an edge extraction circuit for outputting an edge signal by detecting a transition in the input data signal; an clock generator for generating a first clock signal based on an injection of the edge signal, wherein the first clock signal comprises a plurality of phase signals; a second delay buffer for outputting a second clock signal according to the first clock signal; a sampler for outputting a plurality of samples based on sampling the delayed data signal in accordance with the phase signals; and a decision circuit for generating a decision in accordance with the second clock signal based on the three samples and a previous decision.

In an embodiment, a method is disclosed, the method comprising: receiving an input data signal; generating a delayed data signal by delaying the input data signal; generating an edge signal by detecting a transition in the input data signal; generating a first clock signal based on an injection of the edge signal into an injection-locked oscillator, wherein the first clock signal comprises a plurality of phase clocks; generating a second clock signal by delaying the first clock signal; generating a plurality of samples by sampling the delayed data signal using the phase clocks; and generating a decision in accordance with the second clock signal based on the samples and a previous decision.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1A:
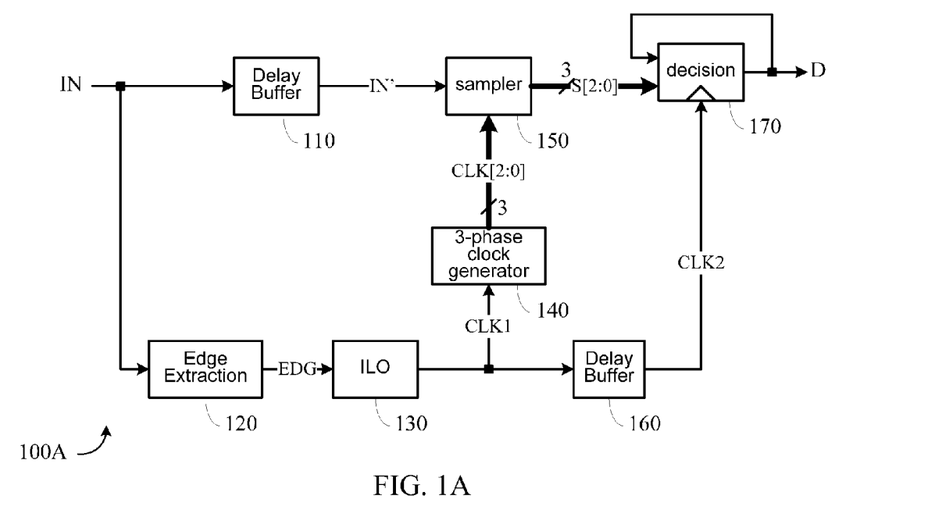
FIG. 1A shows a functional block diagram of an exemplary embodiment of a serial link receiver.

FIG. 1A shows a functional block diagram of an exemplary embodiment of a serial link receiver 100A for receiving a data signal IN and outputting a recovered dada D. Received at a receiving end of a transmission medium and equalized, if applicable, the data signal IN bears information of a serial data stream transmitted from a transmitting end of the transmission medium. A fist embodiment of Receiver 100A comprises: an edge extraction block 120 for outputting an edge signal EDG that tracks a timing of a transition of the data signal IN; an injection locked oscillator (ILO) 130 for outputting a first clock signal CLK1 under an injection of the edge signal EDG; a clock generator 140 for generating a 3-phase clock signal CLK[2:0] from the first clock signal CLK1; a first delay buffer 110 for receiving the data signal IN and outputting a delayed data signal IN'; a sampler 150 for generating three binary samples S[2:0] by sampling the delayed data signal IN' at the three rising edges of the 3-phase clock signal CLK[2:0]; a second delay buffer 160 for receiving the first clock and outputting a second clock CLK2; and a decision circuit 170 for outputting the recovered (binary) data D based on the three binary samples S[2:0] and a previous value of the recovered data D in accordance with a timing of the second clock CLK2.

As long as an injection signal to an ILO 130 bears a spectral component that is sufficiently strong and also sufficiently close to a natural resonant frequency of the ILO 130, an output of the ILO 130 will lock to the injection signal. In apparatus 100A, the timing information embedded in the data signal IN is extracted and represented in the edge signal EDG. Due to the injection locking by the edge signal EDG, the first clock CLK1 effectively locks to a timing of the edge signal, and therefore the timing embedded in the data signal IN. This ensures an effectively timing recovery, even if a SSC (spread spectrum clocking) is employed in the serial link data transmission, as long as the spread is within a locking range of the ILO.

Figure 1B:
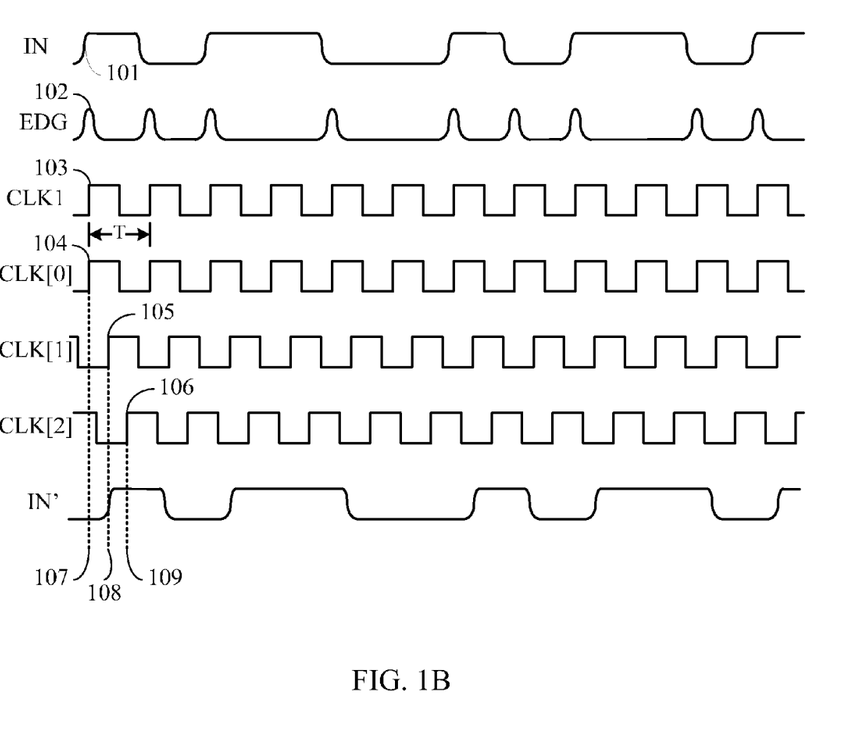
FIG. 1B shows an exemplary timing diagram of the serial link receiver of FIG. 1A.

To illustrate how apparatus 100A works, an exemplary waveform/timing-diagram is shown in FIG. 1B. In FIG. 1B, the horizontal dimension corresponds to time, while the vertical dimension corresponds to signal level (i.e., voltage). The data signal IN is an equalized non-return-to-zero (NRZ) signal, wherein a transition edge occurs when the data make transition from "0" to "1" (i.e. from low to high) or from "1" to "0" (i.e. from high to low). The edge signal EDG comprises a plurality of pulses that track a timing of the transition edges of the data signal IN, with a processing delay. For instance, pulse 102 tracks the timing of the transition edge 101. The first clock signal CLK1 is generated from the ILO 130 of FIG. 1A by injection of the edge signal EDG; therefore, a timing of the first clock CLK1 is substantially aligned with a timing of the edge signal EDG due to a nature of injection. For instance, edge 103 of CLK1 is substantially aligned with pulse 102 of the edge signal EDG. The 3-phase clock CLK[2:0] is generated by the 3-phase clock generator 140 based on a timing of the first clock CLK1. In a preferred embodiment, a phase difference between CLK[0] and CLK[1] is approximately equal to a phase difference between CLK[1] and CLK[2]. In a preferred embodiment: the 3-phase clock generator 140 comprises a third delay buffer and a fourth delay buffer; CLK1 is directly assigned to CLK[0]; CLK[1] is generated by buffering CLK[0] using the third delay buffer; and CLK[2] is generated by buffering CLK[1] using the fourth delay buffer. In the preferred embodiment, the third delay buffer is substantially identical with the fourth delay buffer. In an embodiment, a timing difference between CLK[0] and CLK[1] is less than half of a clock period of the first clock CLK1, and so is a timing difference between CLK[1] and CLK[2]. In a preferred embodiment, a timing difference between CLK[0] and CLK[1] is approximately equal to a third of a clock period of the first clock signal CLK1, and so is a timing difference between CLK[1] and CLK[2]. Let the clock period of the first clock signal CLK1 be T. In this preferred embodiment, as shown in FIG. 1B, edge 105 of CLK[1] trails edge 104 of CLK[0] by approximately T/3, and edge 106 of CLK[2] trails edge 105 of CLK[1] by approximately T/3. In an alternative embodiment (not shown in the figure), ILO 130 directly output a 4-phase clock, and three of them are taken as CLK[2:0]. In this case, the 3-phase clock generator 130 is not needed, CLK[0] is simply the first clock signal CLK1, CLK[1] trails CLK[0] by T/4, and CLK[2] trails CLK[1] also by T/4.

The delayed data signal IN' is substantially similar to the data signal IN except for a delay due to the first delay buffer 110. A circuit delay of the first delay buffer 110 is chosen such that a transition edge of the delayed data signal IN' is substantially aligned with a rising edge of CLK[1]. For instance, transition edge 108 of the delayed data signal IN' is substantially aligned with edge 105 of CLK[1]. Since a transition edge of the delayed data signal IN' is substantially aligned with a rising edge of CLK[1], a rising edge of CLK[0] occurs before a transition of the delayed data signal IN' and a rising edge of CLK[2] occurs after the transition of the delayed data signal IN'. For instance, rising edge 104 of CLK[0] occurs at instant 107, which is before the instant 108 of a transition of the delayed data signal IN'; rising edge 106 of CLK[2] occurs at instant 109, which is after the instant 108 of a transition of the delayed data signal IN'. Binary samples S[0], S[1], and S[2] are obtained by sampling the delayed data signal IN' by the sampler 150 at rising edges of CLK[0], CLK[1], and CLK[2], respectively. In an embodiment, sampler 150 comprises three flip-flops for receiving the same input signal from IN' but triggered at rising edges of CLK[0], CLK[1], and CLK[2], respectively, for outputting S[0], S[1], and S[2], respectively. If there is a transition in the delayed data signal IN' near a particular rising edge of CLK[1] of interest, then S[0] should be the correct data before the transition and S[2] should be the correct data after the transition and should be a logical inversion of S[0]. In this case, S[1] is determined by a meta-stability of the sampler 150 can be either the same as S[0] or the same as S[2]. If there is no transition in the delayed data signal IN' near a particular rising edge of CLK[1] of interest, then all three values, S[0], S[1], and S[2], should be the same.

In an embodiment, the decision circuit 170 updates the recovered data D at a rising edge of CLK2 based on an algorithm described by the following statement

---

If S[0], S[1], and S[2] are all the same
Then set D to S[2] at the next rising edge of CLK2
Else toggle D (to its logical inversion) at the next rising edge of CLK2

---

Figure 1C:
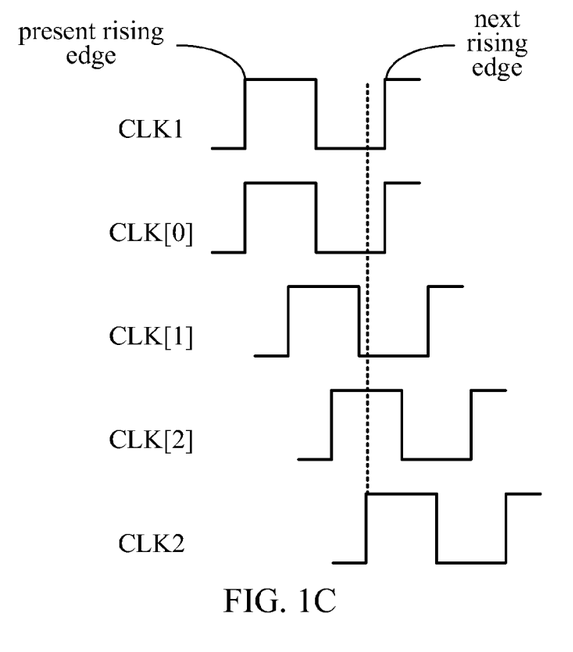
FIG. 1C shows an exemplary timing diagram of a three-phase clock.

In an embodiment, a circuit delay of the second delay buffer 160 is chosen such that: for a present rising edge of CLK1, the timing of the corresponding rising edge of CLK2 is later than that of the corresponding rising edge of CLK[2] but earlier than that of the next rising edge of CLK1, as shown in FIG. 1C. This will ensure that the decision circuit 170 updates the value of D in a timely manner.

In this disclosure, a delay buffer is an apparatus that receives an input signal and outputs an output signal accordingly such that a waveform of the output signal is substantially similar to a waveform of the input signal except for a delay in time. A delay buffer can be implemented, for instance, using a CMOS (complementary metal-oxide semiconductor) inverter chain or a CML (current-mode logic) buffer. The circuit speed of the CMOS inverter or the CML buffer is high enough for the delay buffer to track a change in the input signal and respond accordingly in the output signal. Both CMOS inverter chain and CML buffer are well known to those of ordinary skills in the art and thus not described in detail here. A circuit delay of a CMOS inverter chain can be adjusted by adjusting a supply voltage. A circuit delay of a CML buffer can be adjusted by adjusting a load impedance.

The present invention relies on generating a three-phase clock comprising a first phase, a second phase, and a third phase, wherein the second phase is approximately aligned with a data transition, the first phase is a proper timing for sampling the data before transition, and the third phase is a proper timing for sampling the data after transition. The three-phase clock is generated from an injection into an injection-lock oscillator by an edge signal representing the data transition. To ensure an embodiment works properly, one needs to make sure both of the following two conditions hold: (1) the relative timing between the data and the three-phase clock is set properly; and (2) the edge signal falls in the locking range of the injection-lock oscillator. Usually, further embodiments are needed to ensure both conditions hold.

Figure 1D:
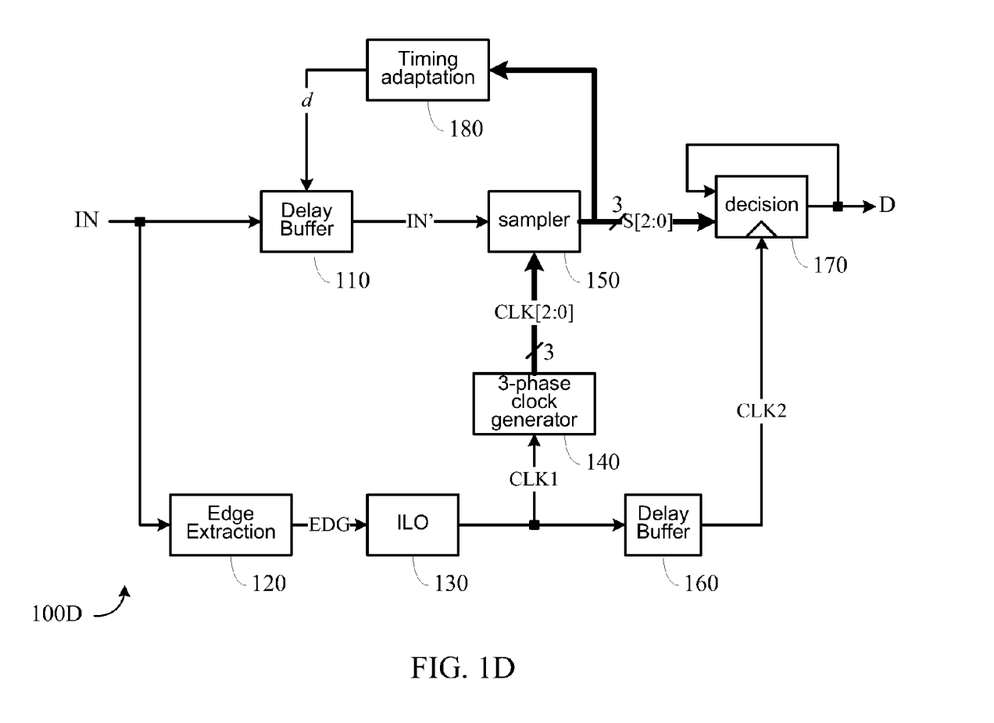
FIG. 1D shows a functional block diagram of a further embodiment of a serial link receiver.

In a further embodiment 100D depicted in FIG. 1D, the circuit delay of the first delay buffer 110, denoted as d, is adjustable and adjusted in a closed-loop manner by a timing adaptation circuit 180 based on S[2:0] so that a transition in the delayed data signal IN' is aligned with a rising edge of CLK[1]. This would ensure that S[0] is a sample before a data transition and S[2] is a sample after the data transition. In an embodiment, the circuit delay d is adjusted in accordance with an algorithm described by the following statement

---

If S[0] is the same as S[2]
Then keep the same d
Else if S[0] is the same as S[1]
Then decrease d
Else increase d

---

In an alternative embodiment, d is not adapted for every S[2:0] but instead based on a statistics after a plurality of S[2:0]. For instance, d is updated for every sixteen S[2:0]: d is decreased if there are more cases where S[0] is the same as S[1] but different from S[2] then the cases where S[2] is the same as S[1] but different from S[0] in these sixteen S[2:0]; d is increased if there are more cases where S[2] is the same as S[1] but different from S[0] then the cases where S[0] is the same as S[1] but different from S[2] in these sixteen S[2:0]; and keep d unchanged otherwise.

In an alternative embodiment that is a twist to embodiment 100D and should be obvious to those of ordinary skill in the arts (and thus not shown in the figure), the circuit delay of the first delay buffer 110 is fixed, but an additional delay buffer (not depicted in the figure) is inserted right after ILO 130. A circuit delay of the additional delay buffer is adjusted in a closed loop manner so as to ensure a transition in the delayed data signal IN' is aligned with a rising edge of CLK[1]. The algorithm for adjusting the circuit delay of the additional delay buffer is the same as the algorithm described above for adjusting the circuit delay of the first delay buffer 110 except that the direction in increasing/decreasing the circuit delay is reversed.

Figure 2A:
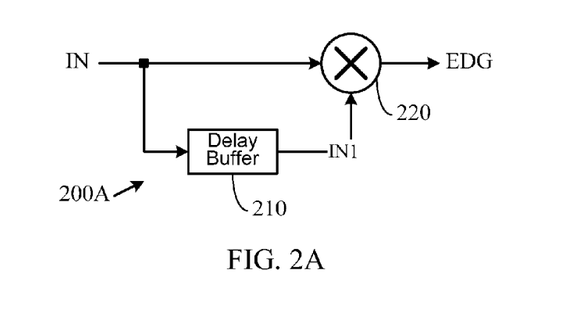
FIG. 2A shows a functional block diagram of an edge extraction apparatus.
Figure 2B:
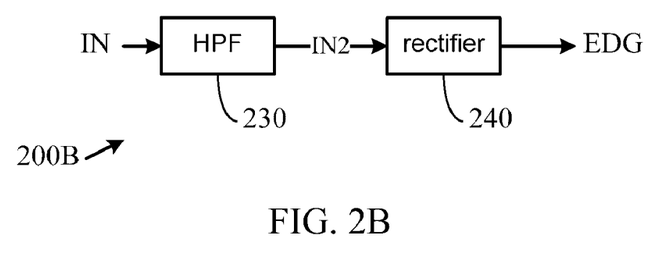
FIG. 2B shows a functional block diagram of an alternative edge extraction apparatus.

An apparatus 200A suitable for embodying the edge extraction block 120 of FIG. 1A is depicted in FIG. 2A. Apparatus 200A comprises: a delay buffer 210 for receiving the input data signal IN and outputting an intermediate signal IN1; and a mixer 220 for outputting the edge signal EDG by performing a mixing of the input data signal IN with the intermediate signal IN1. A mixing is functionally a multiplying operation. A mixer can be implemented, for instance, by a Gilbert-cell mixer that is well known to those of ordinary skill in the art and thus not described in detail here. In a preferred embodiment, apparatus 200A comprises differential circuitry, where a signal comprises a positive end and a negative end. The concept of differential circuitry is well known to those of ordinary skills in the art and thus not described in detail here. This disclosure is intended for those of ordinary skill in the art and is not meant to be a tutorial; therefore, those who don't understand basic concepts of microelectronics should refer to standard texts. An alternative embodiment 200B of an edge extraction block is depicted in FIG. 2B. Embodiment 200B comprises a HPF (high-pass filter) 230 for receiving the input data signal IN and outputting a filtered data signal IN2, and a rectifier 240 for receiving the filtered data signal IN2 and outputting the edge signal EDG. HPF 230 can be embodied by, for instance, a serial capacitor followed by a shunt resistor. Rectifier 240 can be embodied by, for instance, a mixer for performing a self-mixing of IN2 to generate EDG.

Figure 3:
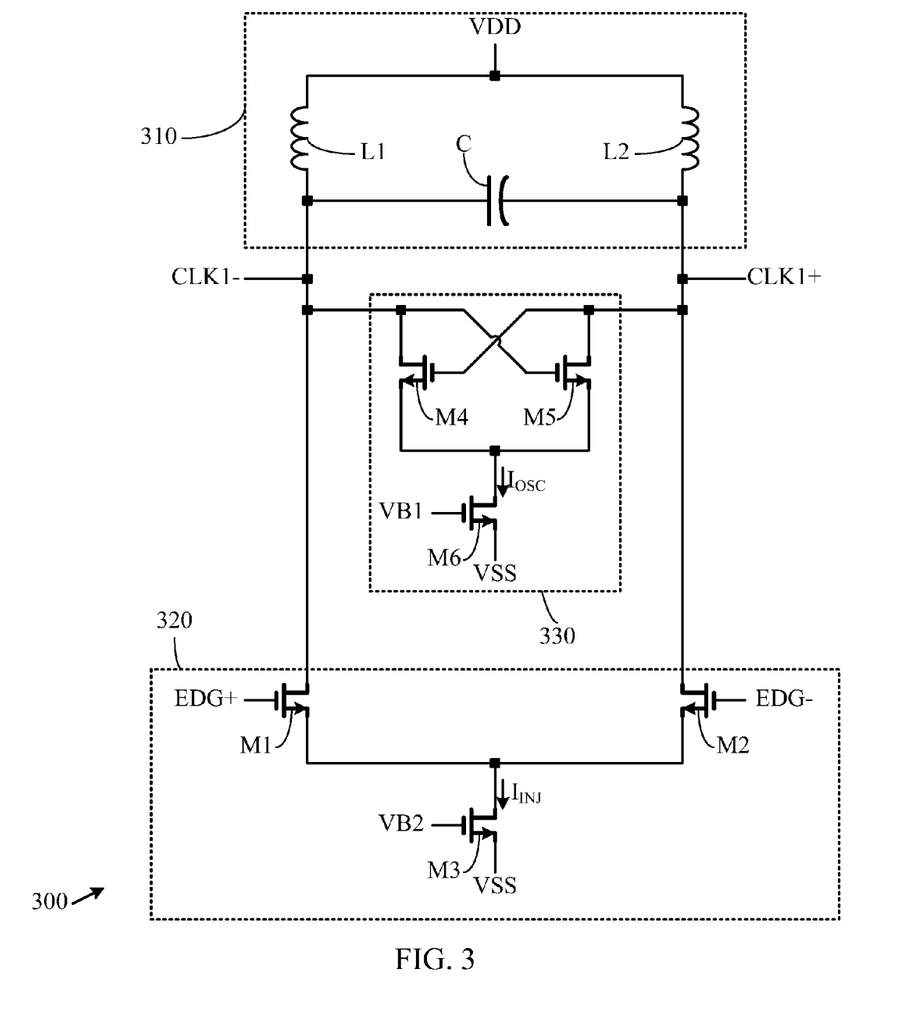
FIG. 3 shows a schematic diagram of an injection locked oscillator.

An apparatus 300 suitable for embodying ILO 130 of FIG. 1A is depicted in FIG. 3. Apparatus 300 comprises: a LC tank 310 comprising two inductors L1 and L2 and a capacitor C for generating the first clock signal CLK1 (in a differential circuit embodiment, comprising a positive end CLK1+ and a negative end CLK1−); an injection circuit 320 comprising a differential pair M1-M2, biased by a tail current $I_{INJ}$ provided by a current source embodied by a transistor M3 biased by a first bias voltage VB2, for receiving the edge signal EDG (in a differential circuit embodiment, comprising a positive end EDG+ and a negative end EDG−) and injecting the edge signal EDG into the LC tank 310; and a regenerative circuit 330 comprising a cross-coupled differential pair M4-M5, biased by a tail current $I_{OSC}$ provided by a current source embodied by a transistor M6 biased by a second bias voltage VB1, for serving as a regenerative load for the first clock signal CLK1 to sustain an oscillation. Throughout this disclosure, VDD denotes a first substantially fixed potential node (known as the power supply node) and VSS denotes a second substantially fixed potential node (known as the ground node). Let a data rate of the input data signal be $f$ (bits per second). Then the edge signal EDG comprises a strong spectral component of frequency $f$ (Hz). For instance, if the data rate of the input signal is 10 Gb/s, then the edge signal EDG comprises a strong spectral component of 10 GHz. As long as a natural resonant frequency of the LC tank 310 is near $f$ (Hz) and the injection strength of the edge signal EDG is strong enough, the first clock signal CLK1 will be synchronized with the edge signal. If the natural resonant frequency of the LC tank 310 is not near $f$ (Hz), however, the function of injection locking of ILO 130 might not work properly.

Figure 1E:
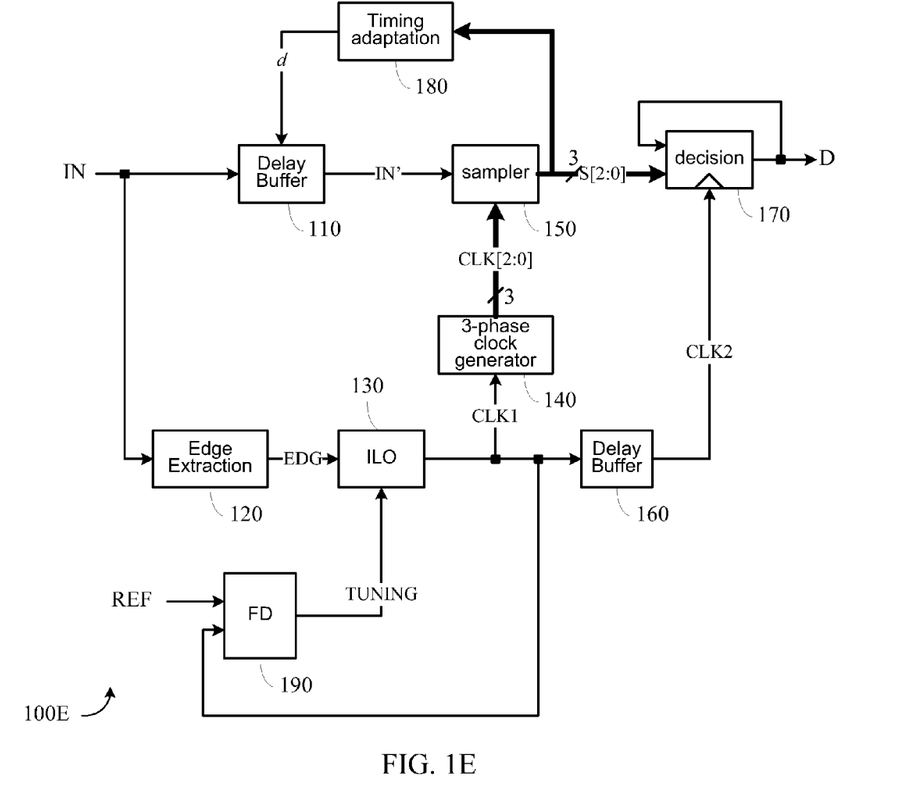
FIG. 1E shows a functional block diagram of yet a further embodiment of a serial link receiver.

In a further embodiment 100E depicted in FIG. 1E, a frequency detector FD 190 is introduced to generate a control signal TUNING to tune the natural resonant frequency of ILO 130 to ensure the natural resonant frequency of ILO 130 is near $f$ (Hz). FD 190 detects a frequency relation between the first clock signal CLK1 and a pre-known reference clock signal REF and adjusts the control signal TUNING accordingly to ensure the frequency of CLK1 is within a lock-in range for ILO 130. In an embodiment, the control signal TUNING is used to control a capacitance of the capacitor C in the LC tank of the ILO 130. For instance, if the nominal data rate of the data signal IN is 10 Gb/s and the reference clock frequency is 25 MHz, then the first clock signal CLK1 should be four hundred times higher in frequency than the reference clock signal REF. In an embodiment, FD 190 comprises a counter for counting a number of clock cycles of the first clock CLK1 for every clock cycle of the reference clock REF. When ILO 130 functions properly, there should be four hundred clock cycles of CLK1 for every clock cycle of REF. If the number exceeds four hundred, it indicates the first clock CLK1 is too fast and the control signal TUNING will be adjusted to increase the capacitance of the capacitor C in the LC tank of the ILO 130 to lower its natural resonant frequency. If the number is below four hundred, it indicates the first clock CLK1 is too slow and the control signal TUNING is adjusted to decrease the capacitance of the capacitor C in the LC tank of the ILO 130 to increase its natural resonant frequency.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    a first delay circuit for receiving an input data signal and outputting a delayed data signal;
    an edge extraction circuit for outputting an edge signal by detecting a transition in the input data signal;
    an clock generator for generating a first clock signal based on an injection of the edge signal, wherein the first clock signal comprises a plurality of phase signals;
    a second delay buffer for outputting a second clock signal according to the first clock signal;
    a sampler for outputting a plurality of samples based on sampling the delayed data signal in accordance with the phase signals; and a decision circuit for generating a decision in accordance with the second clock signal based on the three samples and a previous decision.

2. The apparatus of claim 1 further comprising an adaptation circuit for adjusting a relative timing between the delayed data signal and the clock signals based on the samples.

3. The apparatus of claim 1, wherein the phase clocks comprising a first phase, a second phase, and a third phase, and a timing of the second phase is aligned with a timing of a transition of the delayed data signal.

4. The apparatus of claim 3, wherein a timing difference between the first phase and the second phase is approximately equal to a timing difference between the second phase and the third phase.

5. The apparatus of claim 4, wherein the timing difference between the first phase and the second phase is approximately equal to one third of a unit interval of the input data signal.

6. The apparatus of claim 4, wherein the timing difference between the first phase and the second phase is approximately equal to one quarter of a unit interval of the input data signal.

7. The apparatus of claim 1, wherein a natural resonant frequency of the injection locked oscillator is approximately equal to a data rate of the input data signal.

8. The apparatus of claim 1, wherein a natural resonant frequency of the injection locked oscillator is adjustable.

9. The apparatus of claim 8 further comprising a frequency detector for outputting a control signal to adjust the natural resonant frequency of the injection locked oscillator based by detecting a frequency relation between the first clock signal and a reference clock signal.

10. The apparatus of claim 9, the natural resonant frequency of the injection locked oscillator is adjusted so as to be approximately equal to a data rate of the input data signal.

11. A method comprising:
receiving an input data signal;
generating a delayed data signal by delaying the input data signal;
generating an edge signal by detecting a transition in the input data signal;
generating a first clock signal based on an injection of the edge signal into an injection-locked oscillator, wherein the first clock signal comprises a plurality of phase clocks;
generating a second clock signal by delaying the first clock signal;
generating a plurality of samples by sampling the delayed data signal using the phase clocks; and
generating a decision in accordance with the second clock signal based on the samples and a previous decision.

12. The method of claim 11 further comprising adjusting a relative timing between the delayed data signal and the clock signals based on the samples.

13. The method of claim 11, wherein the three-phase clock comprises a first phase, a second phase, and a third phase, and a timing of the second phase is aligned with a timing of a transition of the delayed data signal.

14. The method of claim 13, wherein a timing difference between the first phase and the second phase is approximately equal to a timing difference between the second phase and the third phase.

15. The method of claim 14, wherein the timing difference between the first phase and the second phase is approximately equal to one third of a unit interval of the input data signal.

16. The method of claim 14, wherein the timing difference between the first phase and the second phase is approximately equal to one quarter of a unit interval of the input data signal.

17. The method of claim 11, wherein a natural resonant frequency of the injection locked oscillator is approximately equal to a data rate of the input data signal.

18. The method of claim 11, wherein a natural resonant frequency of the injection locked oscillator is adjustable.

19. The method of claim 18 further comprising adjusting the natural resonant frequency of the injection locked oscillator based by detecting a frequency relation between the first clock signal and a reference clock signal.

20. The method of claim 19, wherein the natural resonant frequency of the injection locked oscillator is adjusted so as to be approximately equal to a data rate of the input data signal.

\* \* \* \* \*